United States Patent [19]
Lien

[11] Patent Number: 5,479,039
[45] Date of Patent: Dec. 26, 1995

[54] MOS ELECTROSTATIC DISCHARGE PROTECTION DEVICE AND STRUCTURE

[75] Inventor: Chuen-Der Lien, Mountain View, Calif.

[73] Assignee: Integrated Device Technology, Inc., Santa Clara, Calif.

[21] Appl. No.: 125,967

[22] Filed: Sep. 23, 1993

[51] Int. Cl.⁶ .............................. H01L 29/06; H01L 29/78
[52] U.S. Cl. ..................... 257/356; 257/360; 257/363; 361/91; 361/111
[58] Field of Search ..................... 257/357, 358, 257/360, 356, 355, 363, 362, 361; 361/56, 91, 111

[56] References Cited

U.S. PATENT DOCUMENTS 3,967,295 6/1975 Stewart .................. 257/358
4,786,956 11/1988 Puar ....................... 257/363
4,821,096 4/1989 Maloney ................. 257/360

FOREIGN PATENT DOCUMENTS

557850A2 9/1993 European Pat. Off. ........... 361/91
58-54666 3/1983 Japan ........................ 257/357
61-248549 11/1986 Japan ........................ 257/360

OTHER PUBLICATIONS

Sze, "Semiconductor Devices Physics and Technology," 1985, pp. 202 and 212.

Primary Examiner—Jerome Jackson
Assistant Examiner—John F. Guay
Attorney, Agent, or Firm—Skjerven, Morrill, MacPherson, Franklin & Friel; Alan H. MacPherson; E. Eric Hoffman

[57] ABSTRACT

A PMOS transistor is coupled directly to both $V_{CC}$ and $V_{SS}$, for use in an electrostatic discharge (ESD) protection device, thereby protecting the I/O pad(s) of an integrated circuit. The direct coupling of the PMOS transistor to both voltage levels, $V_{CC}$ and $V_{SS}$, greatly reduces the overall ESD hazard, i.e, to all four ESD conditions: 1) positive against $V_{SS}$, 2) negative against $V_{SS}$, 3) positive against $V_{CC}$, and 4) negative against $V_{CC}$, the most critical of these tests being the positive against $V_{SS}$ and positive against $V_{CC}$.

3 Claims, 9 Drawing Sheets

MOS ELECTROSTATIC DISCHARGE PROTECTION DEVICE AND STRUCTURE

FIELD OF THE INVENTION

This invention relates to electrostatic discharge (ESD) protection for MOS semiconductor devices. More particularly, this invention relates to a method of providing ESD protection to the Input/Output (I/O) pads of an MOS integrated circuit (IC) using a minimal circuit area while providing superior tolerance to ESD with respect to both positive and negative voltages relative to both ground ($V_{SS}$) and the supply voltage ($V_{CC}$) and to structure for implementing the method.

BACKGROUND OF THE INVENTION

With the ever decreasing sizes of individual transistors on an MOS IC and the corresponding decrease in the thickness of the gate dielectric (typically an oxide of silicon), ESD protection is increasingly an important factor in determining the reliability and mean time between failure (MTBF) of an IC. In particular, as dielectric thickness decreases, the minimum voltage at which the dielectric will rupture also decreases. For example, conventional MOS type gate dielectrics employ about 500 to 1,000 Angstroms of silicon dioxide which ruptures at 6 to 9 volts per 100 Angstroms. Thus, 30 volts across a 500 Angstrom oxide dielectric could destroy the dielectric.

In addition to oxide rupture, ESD currents on the order of an ampere often appear at the IC input/output (I/O) pads. If the heat generated by these currents is not properly dissipated, electromigration of the metal in the lead pattern and microdiffusion of dopants in the IC can occur. The result is a short between the IC's substrate region and the lead pattern.

Generally an MOS type IC is most susceptible to ESD damage during assembly, test, transfer and installation when the voltage generated by a person handling the IC discharges across the IC's I/O pads. A person can easily develop 1,000 to 10,000 volts. The destructive effect of this high-voltage when discharged across an IC is partially alleviated by the source resistance of the human body. However, the resulting ESD signal can still be very damaging. To prevent dielectric rupture, a protection device for dissipating ESD energy is conventionally connected between each I/O pad of an MOS IC and the IC's internal circuitry.

ESD which can damage an IC can also occur during use. Therefore, ESD protection devices are always required on the input/output (I/O) pads of an IC to protect it from ESD damage.

U.S. Pat. No. 4,786,956 entitled "Input Protection Device for Integrated Circuits" discloses examples of prior art ESD protection devices.

In production, it is important to subject batches of different ICs to an ESD test. ESD testing ensures that the ESD protected ICs that do pass the ESD test will be able to sustain electrostatic discharges within a specified voltage and current range without failure. For example, to simulate electrostatic discharges from a common source, such as a human body, an external 100 pF capacitor is repetitively charged to ever increasing test voltages and discharged through a 1500 Ohm resistor into the I/O pads. These test voltages generally range from 500 V to 5000 V in 500 V increments.

Typically there are four ESD tests conducted during an ESD valuation:

1) positive test voltages with respect to $V_{SS}$ (ground), i.e. positive against $V_{SS}$,
2) negative test voltages with respect to $V_{SS}$, i.e. negative against $V_{SS}$,
3) positive test voltages with respect to $V_{CC}$ (supply voltage), i.e. positive against $V_{CC}$, and
4) negative test voltages with respect to $V_{CC}$, i.e. negative against $V_{CC}$.

For example, in the first test (the positive test voltages with respect to ground) a test probe is placed on the ground pad or pads and a positive voltage relative to the ground pads is then applied in sequence to each of the other pads on the IC. The other tests are conducted in a similar manner with a test probe placed on the appropriate pad containing $V_{SS}$ or $V_{CC}$ and a positive or negative voltage then applied in sequence to each of the other pads on the IC.

In the case of the commonly used NMOS and/or N-field transistor (N-channel transistor with field oxide gate insulation) based ESD protection devices, the most critical tests, i.e. when the ESD protection devices are most vulnerable, are positive against $V_{SS}$ and positive against $V_{CC}$. This is because a conventional NMOS transistor comprises N-type source/drain regions in a P-type substrate or well thereby forming two NP junctions, i.e., between N-type source and P-type substrate, and N-type drain and P-type substrate, respectively. In order to prevent the two NP junctions from conducting when the transistor is in normal operation, the P-type substrate is generally coupled to a slightly negative voltage source with respect to $V_{SS}$, for example, $V_{SS}$–3 V.

However when the N-type drain is subjected to a high negative voltage, e.g. –5 kV, with respect to either $V_{CC}$ or $V_{SS}$, the drain/substrate NP junction becomes forward biased and turns on in a manner similar to an NP diode junction. Conversely when a high positive voltage, e.g. 5 kV, with respect to $V_{CC}$ or $V_{SS}$ is applied to the N-type drain, despite the fact that the P-type substrate is coupled to a slightly negative voltage source with respect to $V_{SS}$, because of the high positive voltage applied to the N-type source, the NP junction formed between the N-type source and the P-type substrate becomes reverse biased and breaks down.

As is well known in the art, an NP junction subject to a high negative voltage, i.e. forward biased, is less likely to be damaged when when the same NP junction is reverse biased, i.e. the NP junction is subjected to a high negative voltage which causes the NP junction to break down.

Hence a high negative voltage turns on the NMOS/N-field FET of an ESD protection device in a forward bias mode, typically when –10 to –30 volts or more, is applied across the drain or source NP junction. Conversely, a high positive voltage, typically +15 volts or more, applied across the same NP junction turns on the NMOS/N-field FET in a breakdown mode. As such, while ESD protection devices based on N-type transistors, can generally sustain up to a 5 kV forward bias across their NP junction(s) without damage, the same NP junction(s) are vulnerable to positive voltage ESD discharges (i.e. NP junctions back biased) of the same magnitude.

Further, current flow through an ESD protection device is generally not uniform, i.e. current flow is not uniform across the active region of a typical MOS transistor. As a result, high power density can be localized in areas oil the transistor where there is high current, increasing the potential for localized ESD damage such as shorts between the substrate and lead pattern described above.

FIG. 1a shows a conventional method of providing ESD protection for an I/O pad 11 using an input ESD protection device 50 comprising an N-field transistor T1, a resistor 12, and a grounded gate NMOS transistor T2. Although resistor 12 is optional, it improves the ESD characteristics of input buffer 10 by introducing a voltage drop between pad 11 and buffer 10 thereby reducing the magnitude of the test voltage at the input node of buffer 11. As discussed above, because transistors T1 and T2 are both N-channel transistors, they can withstand the two negative voltage ESD tests without damage by operating in their forward biased mode.

During the positive against $V_{SS}$ ESD test, a large positive voltage to simulate an electrostatic discharge is applied to pad 11 causing N-field transistor T1 to break down. Being closest to input pad 11, N-field transistor T1 provides a primary current path to ground ($V_{SS}$) for the electrostatic discharge, thereby avoiding a large current surge at the input of buffer 10. Grounded gate (gate G2 is grounded) N-channel transistor T2 further protects the input of buffer driver 10 and the IC's internal circuitry (not shown) coupled to the output of buffer driver 10, by providing a secondary current path to $V_{SS}$ for the ESD discharge. Transistor T2 also operates in the undesirable breakdown mode. As such, ESD protection device 50 is vulnerable to the positive against $V_{SS}$ ESD test.

During the positive against $V_{CC}$ ESD test, since transistor T1 is not coupled to $V_{CC}$, i.e. none of the nodes of transistor T1 is directly coupled to $V_{CC}$, there is no direct path between drain D1 of transistor T1 and $V_{CC}$ for current from the ESD test to flow. As such, transistor T1 cannot efficiently conduct the ESD test current to $V_{CC}$. Instead, the ESD current has to take an indirect path to $V_{CC}$, for example, via source S1 (only coupled directly to $V_{SS}$), causing transistor T2 (also only coupled directly to $V_{SS}$) to absorb more energy while operating in its undesirable breakdown mode. Hence, ESD protection device 50 is most vulnerable to the positive against $V_{CC}$ ESD test. Further, device 50 also uses two transistors T1 and T2 for operation.

In one variation of ESD protection device 50, N-field transistor T1 is replaced by a large NMOS transistor with an extended active area, i.e. with an extended N-channel. Such an ESD device comprises the large NMOS transistor, resistor 12, and NMOS transistor T2. The large NMOS transistor of such an ESD protection device performs the function of transistor T1 of device 50, by turning on or breaking down when the ESD voltages exceed, for example, −15 volts or +15 volts, respectively, with respect to $V_{CC}$ or $V_{SS}$.

FIG. 1b shows another conventional ESD protection device 51 comprising a resistor 12 and an NMOS transistor T2 with its gate G2 grounded directly to $V_{SS}$. Resistor is optional as shown in ESD protection device 52 of FIG. 1c and performs a similar function to that of resistor of device 50. In botch ESD protection devices 51 and 52, NMOS transistor T2 absorbs most of the ESD energy thereby avoiding a large current surge into the input of buffer driver 10 when subject to the ESD test voltages. N-channel transistor T1 of devices 51, 52 operates in a manner similar to transistor T2 of device 50, except that transistor T2, being the only transistor in device 50, has to absorb most of the energy from the ESD discharges. As such, devices 51 and 52 have all the disadvantages of device 50 but are smaller than device FIGS. 1d and 1e show variations 53, 54 of ESD protection devices 51 and 52, respectively, wherein the gate G2 of transistor T2 is coupled to the output of an inverter 15 whose input is coupled to $V_{CC}$. Resistor 12 is optional as shown in ESD device 54 and performs the same function as resistor 12 of device 50. Again, NMOS transistor T2 of ESD protection devices 53 and 54 absorbs most of the ESD energy by providing a current path for the ESD discharge thereby protecting the input of buffer 10. As discussed above, because ESD protection devices 53 and 54 have N-channel transistor T2, they are able to sustain the negative voltage ESD tests without damage by operating in forward biased mode. Devices 53 and 54 are slightly less vulnerable to positive against $V_{SS}$ discharges than devices 51, 52 because in devices 53 and 54 the voltage level at gate G2 of transistor T2 is undefined since the IC is not powered (i.e. no $V_{CC}$ voltage is applied) during ESD testing, i.e. gate G2 of transistor T2 is neither coupled to a high or low logic level thereby allowing transistor T2 to partially turn-on.

During the positive against $V_{CC}$ test, there is no direct current path from source S2 of transistor T2 to $V_{CC}$. Hence transistor T2's capacity to efficiently conduct current from this ESD test. is reduced. Nevertheless, devices 53 and 54 are slight improvements over device 50 because the voltage level at gate G2 of transistor T2 is undefined which allows transistor T2 to partially turn on, thereby reducing the proportion of ESD current flow in the undesirable breakdown mode.

FIGS. 1f and 1g show conventional ESD protection devices 55 and 56, respectively. Output ESD protection device 55 has a pull-down NMOS transistor T4 and a pull-up MOS transistor T3, which although shown as a PMOS transistor can either be a PMOS or an NMOS transistor. ESD protection device 55 protects output buffer drivers 20, 21 from electrostatic discharges at an output pad 22. Similarly, ESD protection device 56 protects the input of buffer driver 10 and output buffer drivers 20 and 21, coupled to a tri-state I/O pad 23. Gates G3 and G4 of transistors T3 and Tt, respectively, are coupled to their respective output buffer drivers 20 and 21. Again, resistor 12 is optional and operates like resistor 12 of device 50.

N-channel transistor T4 operates in a manner similar to transistor T2 of devices 53 and 54 as described above, with the same drawbacks. The introduction of transistor T3 coupled through resistor 12 to I/O pads 22, 23 and directly to $V_{CC}$, as shown in FIGS. 1f and 1g, respectively, improves the results of the positive against $V_{CC}$ ESD test by providing a current path from the drain of transistor T3 to $V_{CC}$. If transistor T3 is an NMOS transistor, it conducts most of the ESD current to $V_{CC}$ in the undesirable breakdown mode (transistor T3 is partially on since the input voltage gate G3 is floating, i.e. not coupled to a node having either a high or low logic level). Alternatively, if transistor T3 is a PMOS transistor as shown in FIGS. 1f, 1g, then transistor T3 is able to conduct current to $V_{CC}$ in the more desirable predominantly forward-biased mode.

Nevertheless, ESD protection devices 55 and 56 each require two transistors T3 and T4 instead of one transistor. In addition, because FET T3 is not coupled directly to $V_{SS}$ and FET T4 is an N-channel FET, devices 55 and 56 both lack a direct and predominantly forward biased current path from pad 22 to $V_{SS}$ when subjected to the positive against $V_{SS}$ ESD test, causing the ESD test current to flow through an indirect and potentially damaging path (not shown) towards $V_{SS}$.

Although conventional ESD protection devices 55 and 56 are improvements over ESD protection devices 50 through 54, by providing slightly improved protection from positive against $V_{CC}$ electrostatic discharges, there is one remaining test i.e., positive against $V_{SS}$, the potentially most destructive of the four ESD tests for the reasons discussed above, wherein conventional ESD protection devices 50–56 offer inadequate ESD protection.

Accordingly, there is a need for an ESD protection device that provides good protection for all four ESD tests, in particular the critical positive against $V_{SS}$ test. Further, such an ESD protection device should also not substantially increase the number of transistors, i.e., the total circuit area.

SUMMARY Or THE INVENTION

In accordance with the invention, prior art difficulties arising from the inability to fabricate a compact ESD protection device capable of sustaining fairly high voltages generated during all four ESD tests are overcome by a single PMOS Transistor coupled to both $V_{CC}$ and $V_{SS}$. Because the substrate and the drain of the PMOS transistor are directly coupled to $V_{CC}$ and $V_{SS}$, respectively, such a PMOS ESD structure has improved characteristics with respect to the critical positive against $V_{SS}$ and positive against $V_{CC}$ ESD tests because the ESD current flows through a forward biased PN junction of PMOS FET. In the preferred embodiment, the drain of the PMOS transistor is connected to $V_{SS}$, the source of the PMOS transistor is connected to an I/O pad, the gate of the PMOS transistor is coupled to $V_{CC}$, and the N-well of the PMOS transistor coupled to $V_{CC}$.

BRIEF DESCRIPTION 0F THE DRAWINGS

Figure 1A:
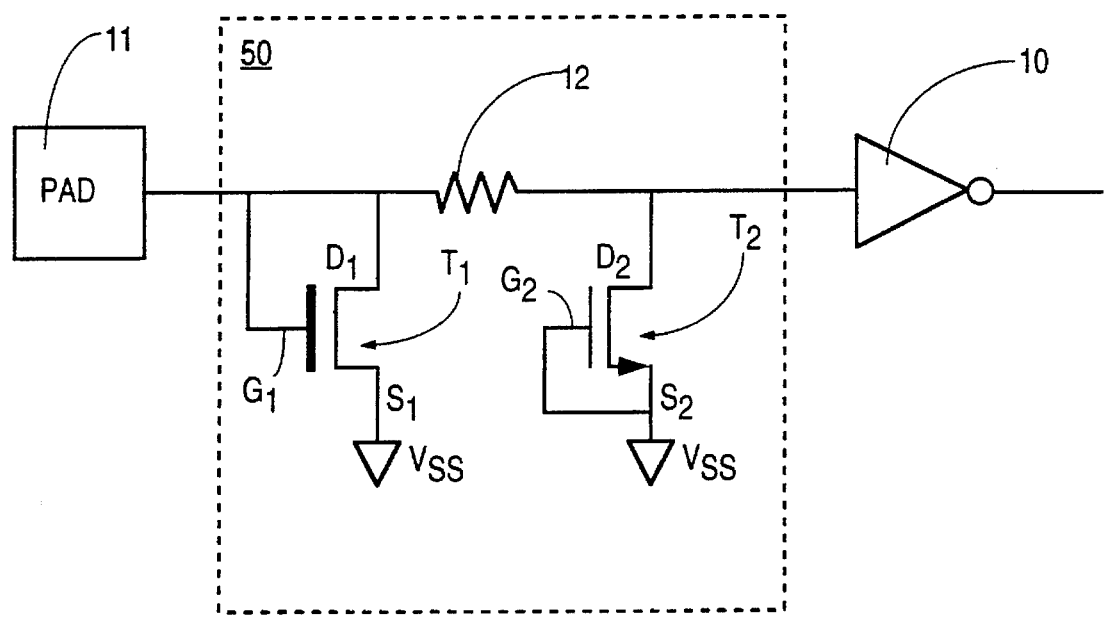
FIGS. 1a through 1g show conventional ESD protection structures providing ESD protection for the I/O pad.
Figure 1B:
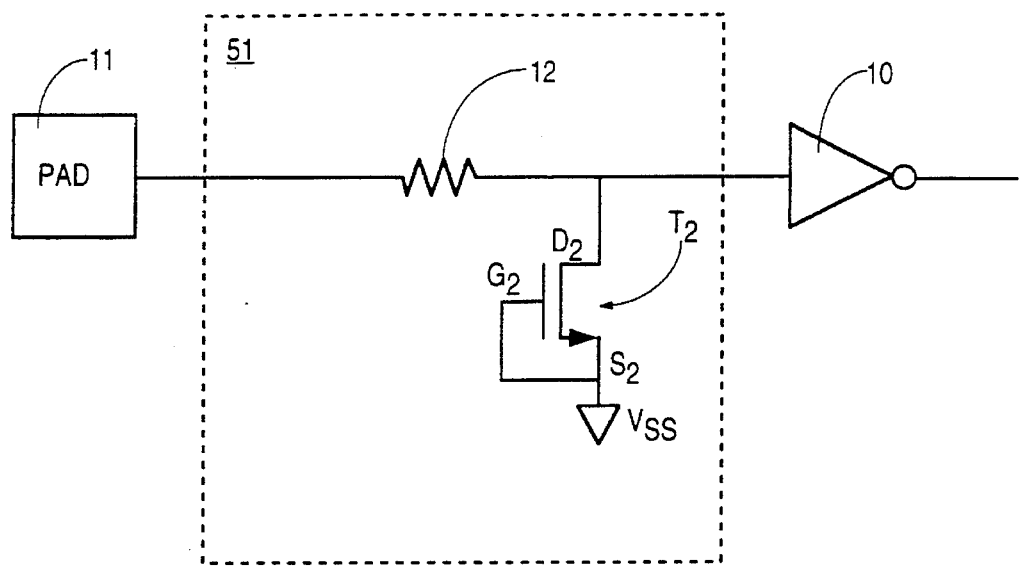
Figure 1C:
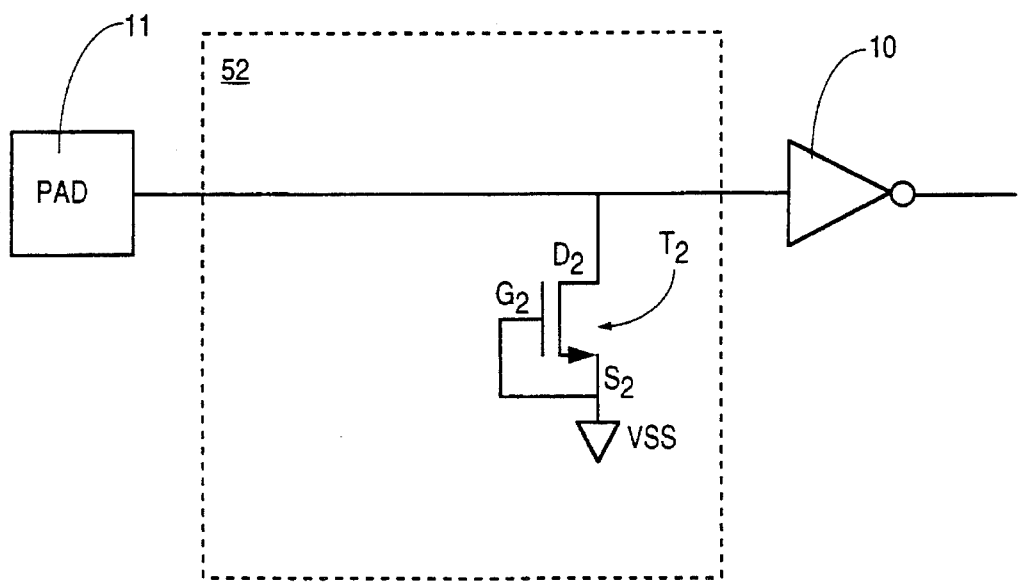
Figure 1D:
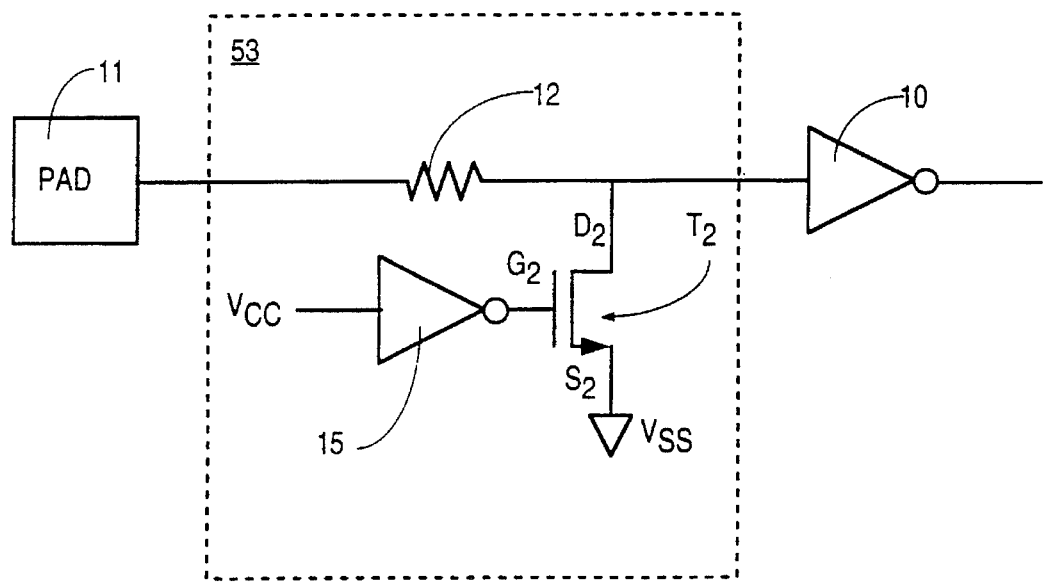
Figure 1E:
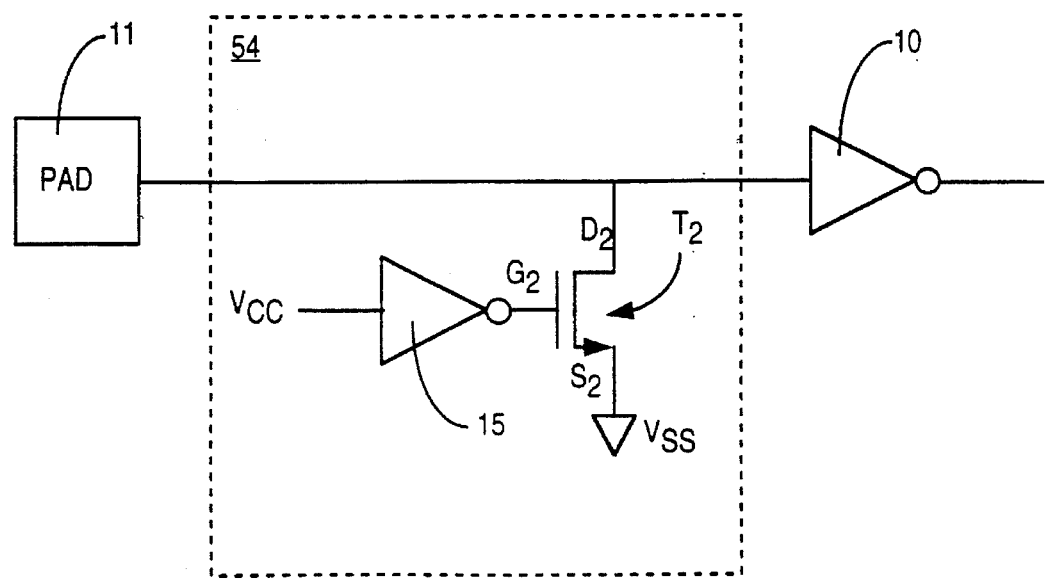
Figure 1F:
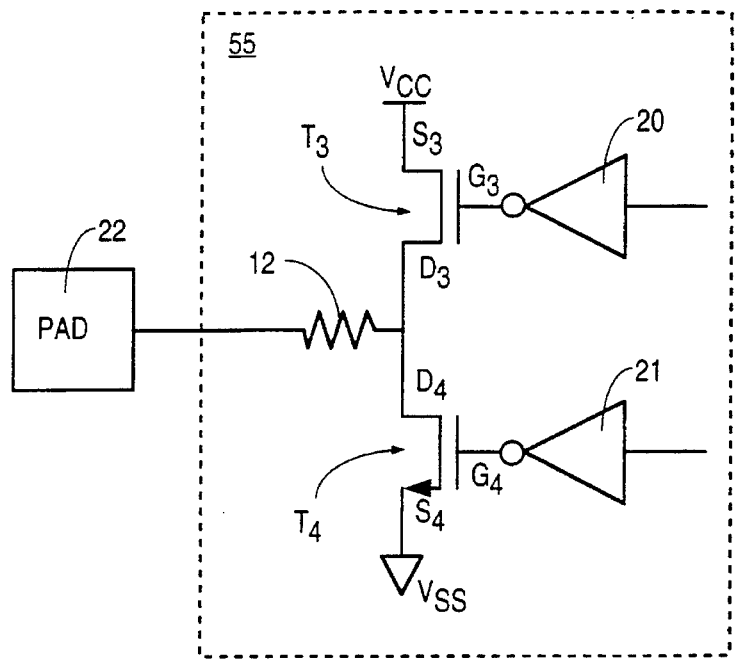
Figure 1G:
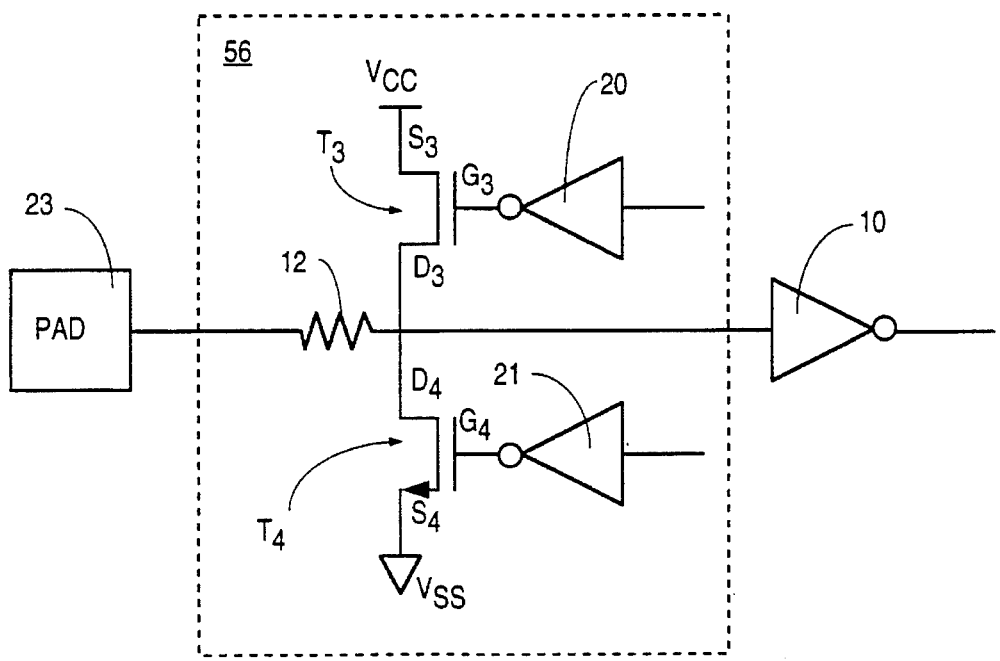
Figure 2A:
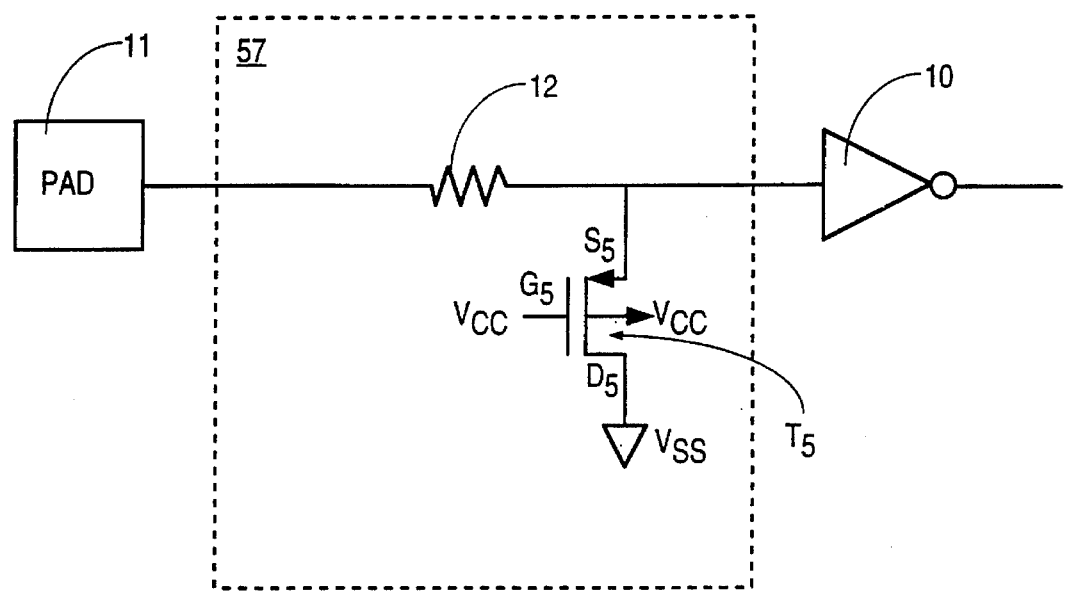
FIGS. 2a and 2b illustrate two variations of an ESD protection structure of this invention having an I/O pad coupled to the source of a PMOS transistor, with the gate coupled to $V_{CC}$ and the drain coupled to $V_{SS}$.
Figure 2B:
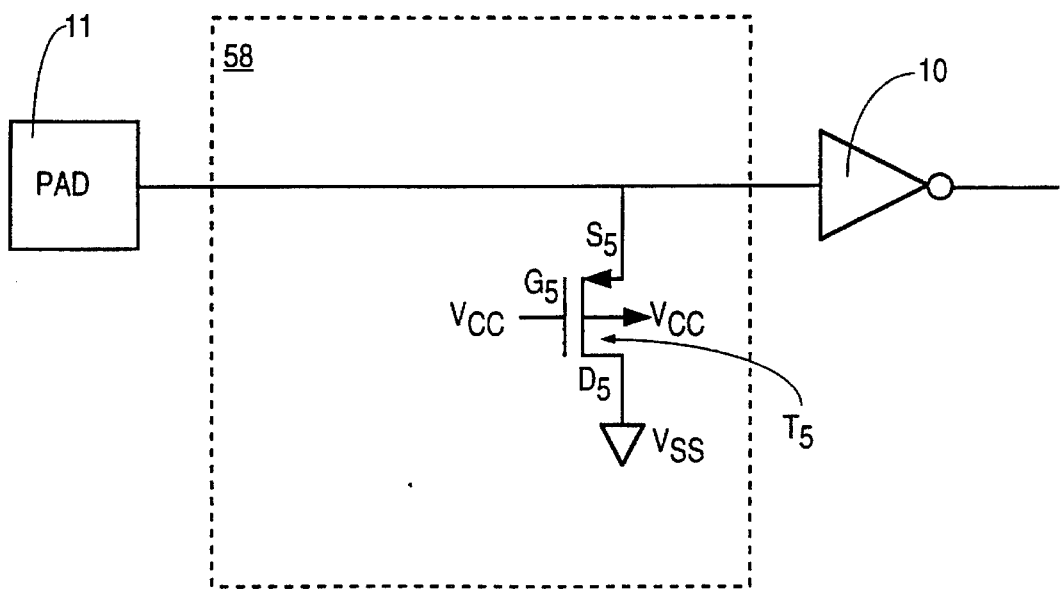
Figure 2C:
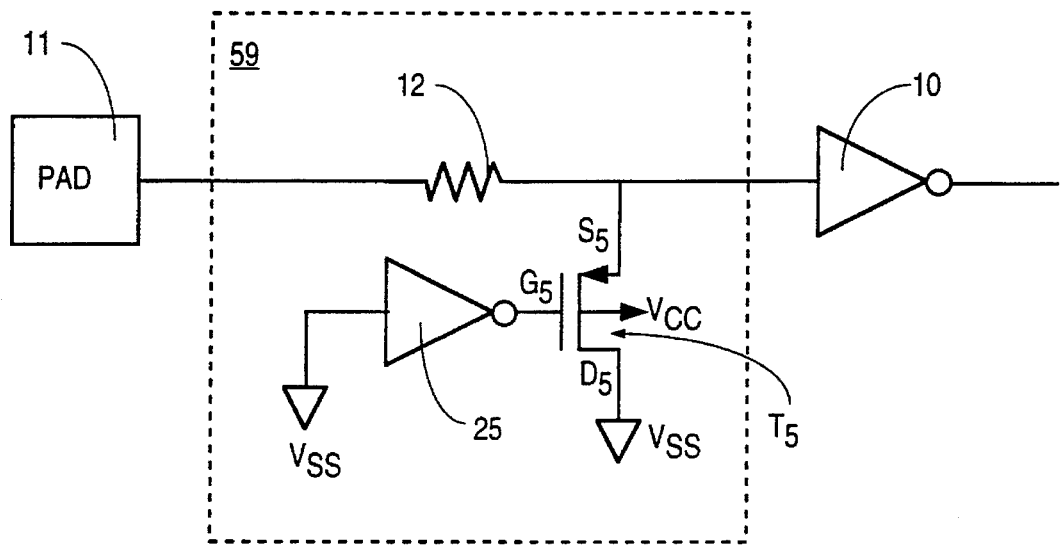
FIGS. 2c and 2d show two variations of an ESD protection structure having an I/O pad coupled to the source of a PMOS transistor, with the drain coupled to $V_{SS}$ and the gate coupled to the output of an inverter whose input is coupled to $V_{SS}$.
Figure 2D:
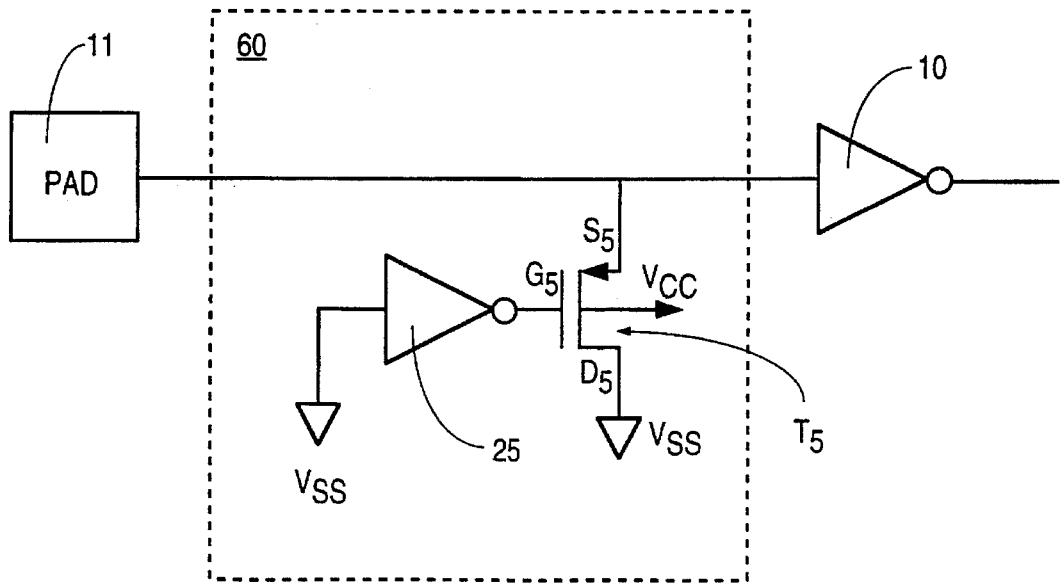
Figure 2E:
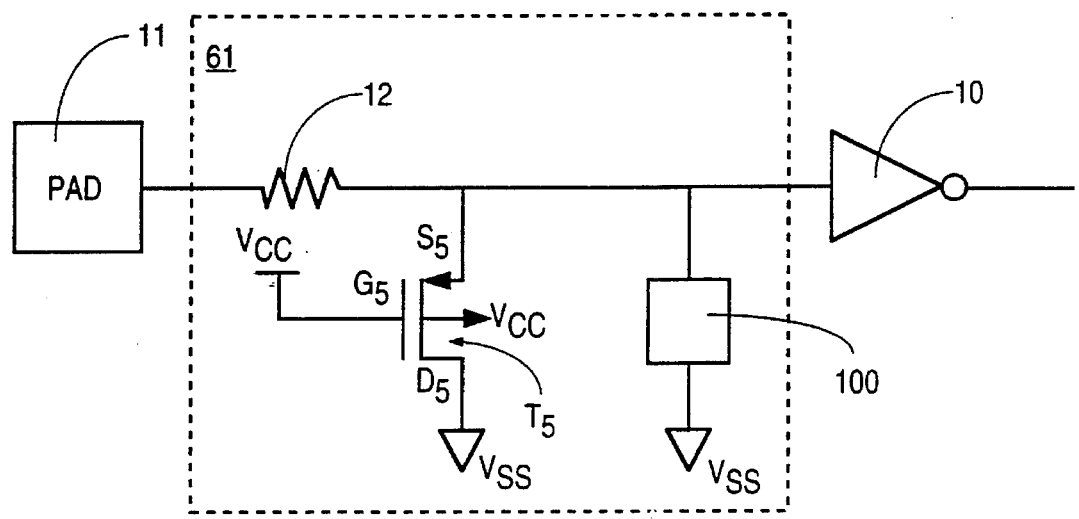
Figure 2F:
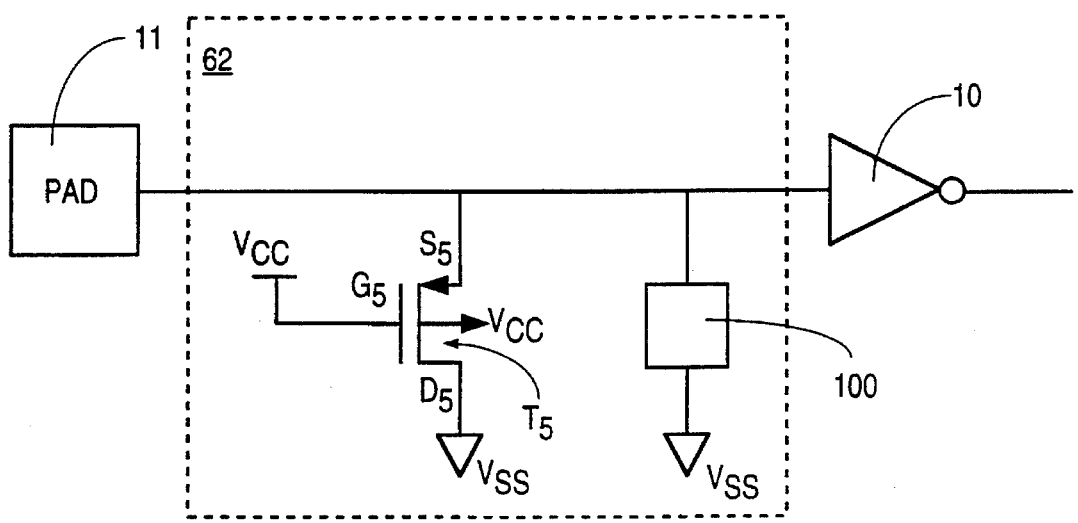

FIGS. 2e and 2f show two variations of the ESD protection structures of FIGS. 2a and 2b, respectively, combined with one of the structures of FIGS. 1a through 1g.

Figure 2G:
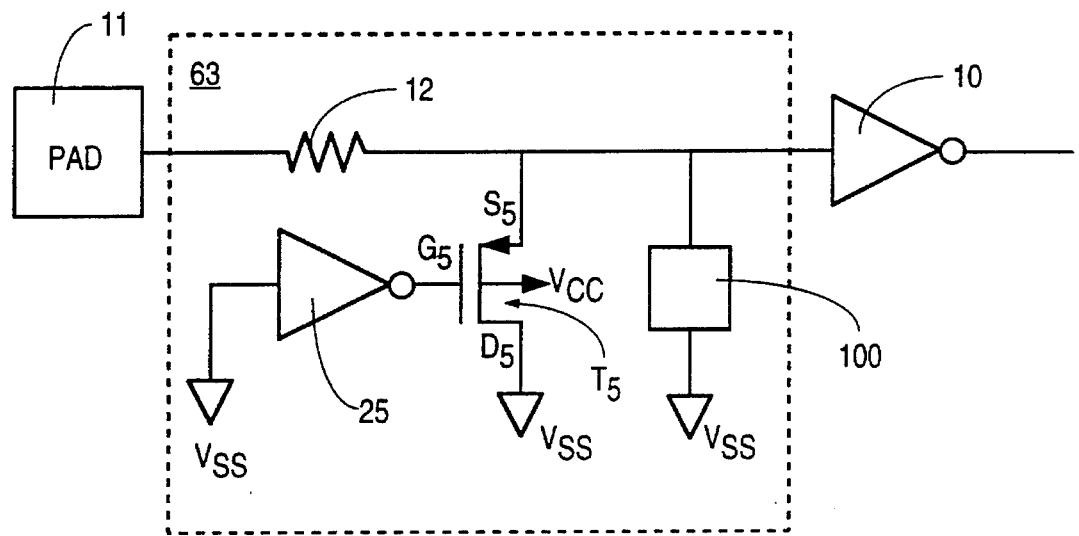
Figure 2H:
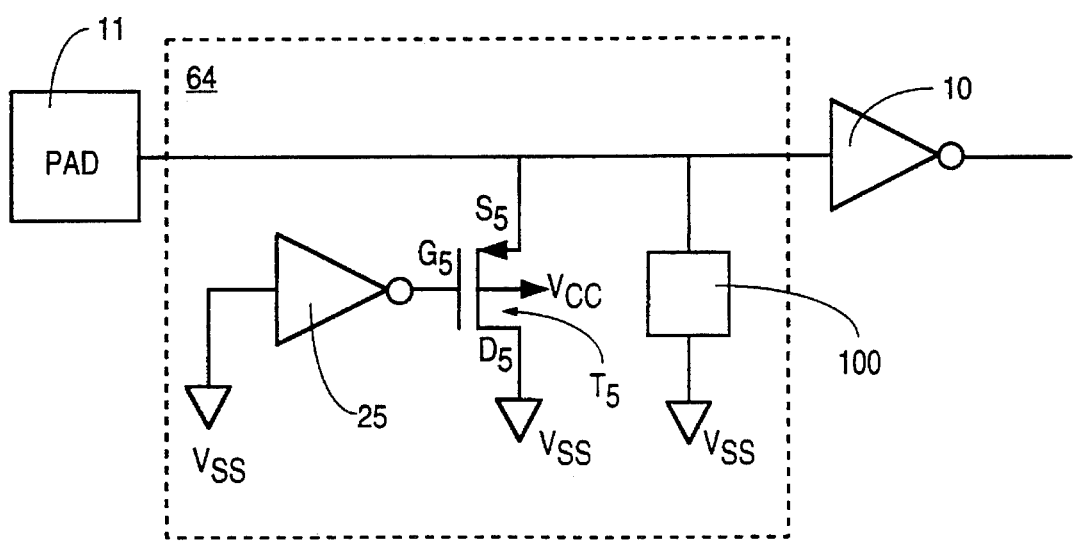

FIGS. 2g and 2h show two variations of the ESD protection structures of FIGS. 2c and 2d, respectively, combined with any one of the structures of FIGS. 1a through 1g.

Figure 3A:
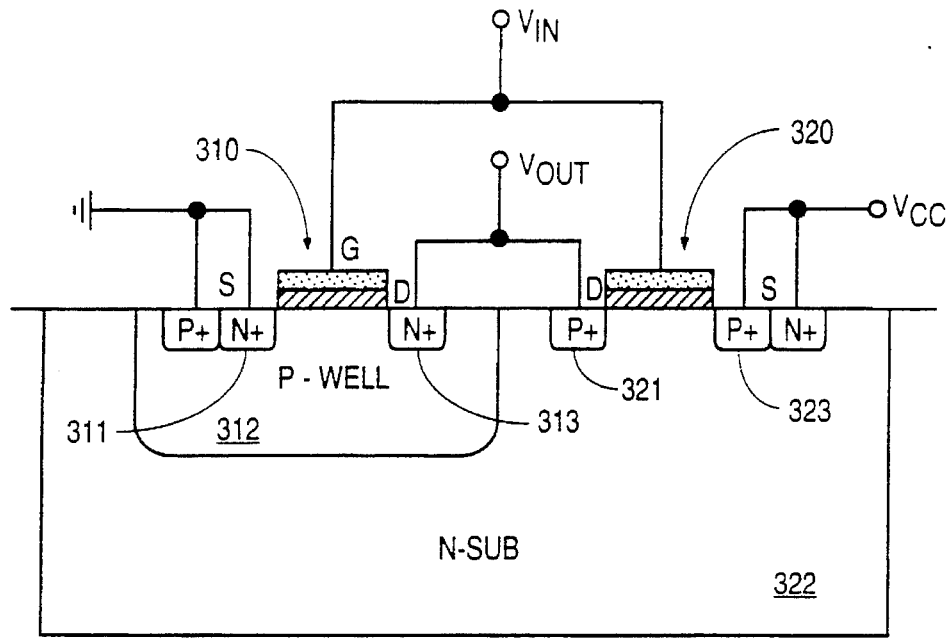
Figure 3B:
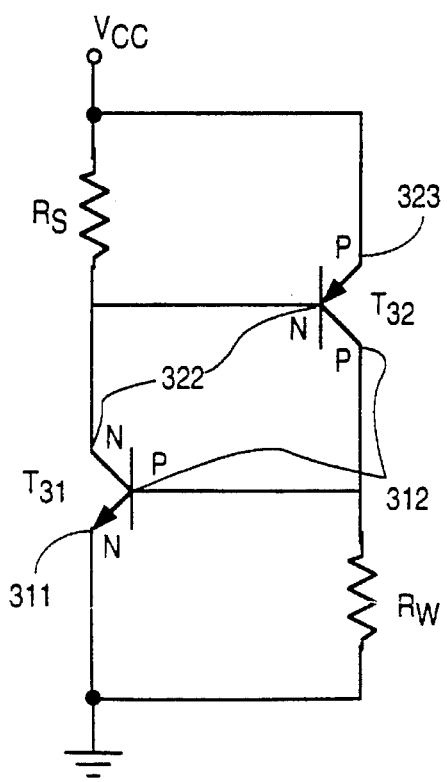

FIGS. 3a and 3b are a cross-sectional view of a CMOS structure and an equivalent circuit of the CMOS structure having parasitic transistors, respectively.

DETAILED DESCRIPTION OF THE INVENTION

Referring to the drawings, FIGS. 2a–2h illustrate different embodiments of a PMOS ESD protection device in accordance with the invention. In two variations devices 57, 58 of a first embodiment, as shown in FIGS. 2a and 2b, I/O pad 11 is coupled either directly (FIG. 2b) or through an optional resistor 12 (FIG. 2a) to the source of a PMOS transistor T5, the gate G5 of T5 is coupled directly to $V_{CC}$, and the drain D5 of T5 is coupled to $V_{SS}$. PMOS transistor T5 is also situated within an N-well which is coupled to $V_{CC}$. Resistor 12 of device 57 provides additional ESD protection by absorbing some of the ESD energy and providing a voltage differential between input pad 11 and source S5 of transistor T5 thereby reducing the voltage differential between source S5 and both $V_{CC}$ and $V_{SS}$.

During the critical positive against $V_{SS}$ ESD test, the ESD high voltage forward biases the P+ source/N-well junction, and breaks down the back biased N-well/P+ drain junction resulting in ESD current flowing from pad 11 through the source, the N-well and into the drain of transistor T5 which is coupled to $V_{SS}$. Similarly, during the positive against $V_{CC}$ ESD test, the ESD voltage causes the P+ source/N-well junction to be forward biased, with current flowing from pad 11 through the source and into the N-well of transistor T5 which is coupled to the $V_{CC}$.

During the negative against $V_{CC}$ and negative against $V_{SS}$ tests, the single PMOS transistor T5 of devices 57 and 58 is reverse-biased and hence operates predominantly in breakdown mode. Note that although the gate G5 of transistor T5 is coupled to $V_{CC}$, since there is no power applied to the IC, $V_{CC}$ is at an undefined voltage potential and so transistor T5 is partially on. As such, PMOS transistor T5 is still more robust than an NMOS transistor because PMOS transistor T5 with an N-type gate G5 conducts through a "buried" channel formed below the surface the P-doped channel region that has not been depleted whereas an NMOS transistor conducts through a surface channel formed by an inversion layer.

In addition, PMOS transistor ESD protection devices 57 and 58 have the advantage of improved latch-up immunity. Latch-up results from a parasitic bipolar transistor (which exists intrinsically in a CMOS structure) turning on. Such a parasite bipolar transistor can short the $V_{CC}$ (power) and $V_{SS}$ (ground) lines, either destroying the IC or causing system failure. The parasitic bipolar effect is illustrated in FIGS. 3a and 3b. FIGS. 3a and 3b show a typical CMOS structure comprising a pair of PMOS and NMOS transistors 320, 310 respectively, and the equivalent "bipolar" circuit for the CMOS structure having parasitic bipolar transistors T31, T32, respectively. The latch-up effect is caused by the switching "on" of two bipolar transistors T31 and T32.

Parasitic bipolar transistor T31, an NPN transistor, is the result of a collector 322 formed from the N-type substrate 322, a base 312 formed from the P-well 312 of an NMOS transistor 310, and an emitter 311 formed from the N+ source 311 of NMOS transistor 310. Similarly, parasitic bipolar PNP transistor T32 is the result of an emitter 323 formed from the P+ source 323 of PMOS transistor 320, a base 322 formed from the N-type substrate 322 and a collector 312 formed from the P-well 312 of NMOS transistor 310. When both bipolar transistors T31 and T32 are "on" there is a very low resistance path comprising transistors T31 and T32, from $V_{CC}$ to $V_{SS}$. The result is a very large current flowing from $V_{CC}$ to $V_{SS}$ through transistors T31 and T32 which can be large enough to cause a power failure. One conventional solution has been the use of a highly doped buried N+ layer electrically insulating and separating the P-well of the NMOS transistor from the N-type substrate. However, the buried layer increases the CMOS transistor size.

The pair of PMOS and NMOS transistors T3 and T4 of ESD protection device 55 (FIG. 1F) forms the above described latch-up path comprising parasitic transistors T31 and T32. In contrast, latch-up immunity of PMOS transistor ESD protection devices 57 and 58 is improved because the drain of transistor T5 is coupled to Vs (instead of $V_{CC}$), thereby improving latch-up immunity by eliminating a critical portion of the latch-up path, i.e. $V_{CC}$ is decoupled from the emitter of the otherwise parasitic transistor T32.

This structure 57 or 58, i.e., with the single PMOS transistor T5, can also be used in combination with one or more of the conventional NMOS ESD protection structures 50 through 56, of FIGS. 1a through 1g. Nevertheless, depending on specific ESD requirements, a single PMOS transistor ESD protection structure is adequate for most IC applications, since the potentially more destructive ESD tests are the positive against $V_{SS}$ and positive against $V_{CC}$. As such, the single PMOS transistor ESD protection device has superior overall ESD characteristics when compared to any of the above-described conventional NMOS transistor based ESD protection devices.

In another embodiment, ESD protection device 59 and a variation 60, as shown in FIGS. 2c and 2d, respectively, I/O pad 11 is coupled either through optional resistor 12 or directly to the source of the PMOS transistor T5. Again the drain of transistor T5 is coupled to $V_{SS}$ and transistor T5 is located in an N-well coupled to $V_{CC}$. The gate of transistor T5 is coupled to the output of an inverter 25 whose input is coupled to $V_{SS}$. Such a single PMOS ESD device 59 or 60 has the same advantages and functions as single PMOS ESD protection devices 57 or 58. (See FIGS. 2a and 2b.)

FIGS. 2e and 2f show variations 61 and 62 of ESD protection devices 57 and 58, respectively. In ESD protection devices 61 and 62, the gate of transistor T5 is coupled directly to $V_{CC}$. In addition, ESD protection devices 61 and 62 are combined with any one of ESD protection devices 50–56, by incorporation into block 100, for better overall protection against all four types of ESD tests.

FIGS. 2g and 2h show variations 63 and 64 of ESD protection devices 59 and 60, respectively. The difference is that the respective ESD protection devices 63 and 64 have been combined with one of ESD devices 50 through 56 by incorporation into block 100, for better overall protection against all four types of ESD tests.

While several embodiments have been described, these descriptions are not intended to be limiting and other embodiments will be obvious to those skilled in the art based on this disclosure. Thus, while this ESD protection invention has been described using a single PMOS transistor coupled directly to both $V_{SS}$ and $V_{CC}$, with the transistor situated in an N-well coupled to $V_{CC}$, the principles of this invention apply equally well to any ESD protection device having a PMOS transistor coupled directly to $V_{SS}$.

I claim:

1. An electrostatic discharge protection structure for an I/O pad of an integrated circuit having a semiconductor substrate, said structure comprising:
   - a first terminal to permit application thereto of a first supply voltage;
   - a second terminal to permit application thereto of a second supply voltage; and
   - a PMOS transistor having a drain coupled to said first terminal, a source coupled directly to the I/O pad, and a gate coupled to an output node of an inverter whose input node is coupled to said first terminal, wherein said PMOS transistor is disposed within an N region and said N-region is coupled to said second terminal.

2. The structure of claim 1 further comprising a second transistor coupled between said I/O pad and said first terminal.

3. The structure of claim 1 wherein said first supply voltage is ground.

* * * * *